(12) United States Patent
Ahamed et al.

(10) Patent No.: US 10,605,538 B2
(45) Date of Patent: Mar. 31, 2020

(54) HEAT SPREADING MODULE FOR PORTABLE ELECTRONIC DEVICE

(71) Applicant: FUJIKURA LTD., Tokyo (JP)

(72) Inventors: Mohammad Shahed Ahamed, Tokyo (JP); Yuji Saito, Tokyo (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 94 days.

(21) Appl. No.: 15/082,761

(22) Filed: Mar. 28, 2016

(65) Prior Publication Data

US 2016/0295739 A1 Oct. 6, 2016

(30) Foreign Application Priority Data

Mar. 30, 2015 (JP) ................. 2015-069308

(51) Int. Cl.
*F28D 15/02* (2006.01)
*F28D 15/04* (2006.01)
(Continued)

(52) U.S. Cl.
CPC ..... *F28D 15/0233* (2013.01); *F28D 15/0275* (2013.01); *F28D 15/046* (2013.01);
(Continued)

(58) Field of Classification Search
CPC .. F28D 15/02; F28D 15/0233; F28D 15/0275; F28D 2015/0216;
(Continued)

(56) References Cited

U.S. PATENT DOCUMENTS 5,355,942 A * 10/1994 Conte ................. F28D 15/0233
165/104.33
5,651,414 A 7/1997 Suzuki et al.
(Continued)

FOREIGN PATENT DOCUMENTS

JP 07-190655 A 7/1995
JP 2009-198173 A 9/2009
(Continued)

OTHER PUBLICATIONS

Communication dated Jun. 14, 2016 from the Japanese Patent Office in counterpart Application No. 2015-069308.
(Continued)

*Primary Examiner* — Eric S Ruppert
*Assistant Examiner* — Hans R Weiland
(74) *Attorney, Agent, or Firm* — Sughrue Mion, PLLC (57) ABSTRACT

A heat spreading module for a portable electronic device includes a metal plate to which a heat generation body contacts, a first heat pipe that is attached along the metal plate, transfers heat of a heating region of the metal plate, to which the heat generation body contacts, to a region that is away from the heating region of the metal plate, comprises a first end portion and a second end portion, has a predetermined length, and a portion of the first end portion is arranged in the heating region, and a second heat pipe that is arranged away from the heating region and is longer in length than the first heat pipe.

10 Claims, 5 Drawing Sheets

(51) Int. Cl.
  *F28F 21/08* (2006.01)
  *H01L 23/427* (2006.01)
  *G06F 1/20* (2006.01)

(52) U.S. Cl.
  CPC .......... *F28F 21/084* (2013.01); *F28F 21/085* (2013.01); *G06F 1/20* (2013.01); *H01L 23/427* (2013.01)

(58) Field of Classification Search
  CPC . F28D 2015/0225; H01L 23/427; H05K 7/20; H05K 7/2039; H05K 7/20336; H05K 7/2099
  See application file for complete search history.

(56) References Cited

U.S. PATENT DOCUMENTS

| | | | | |
|---|---|---|---|---|
| 5,937,936 A * | 8/1999 | Furukawa | ............ | F28D 15/0233 165/104.26 |
| 7,342,788 B2 * | 3/2008 | Nikfar | ................. | F28D 15/0233 165/104.33 |
| 7,520,316 B2 * | 4/2009 | Xia | ..................... | F28D 15/0275 165/104.21 |
| 7,621,316 B2 * | 11/2009 | Kawabata | ........... | F28D 15/0275 165/104.21 |
| 7,911,794 B2 * | 3/2011 | Hasegawa | ............. | H01L 23/427 165/104.26 |
| 7,921,663 B2 * | 4/2011 | Ueno | ................. | F28D 15/0275 165/104.33 |
| 8,388,196 B2 * | 3/2013 | Wang | ................... | F28D 15/0275 362/249.02 |
| 2003/0086454 A1 * | 5/2003 | Nagano | ............... | H01S 5/02423 372/35 |
| 2005/0098300 A1 | 5/2005 | Kawabata et al. | | |
| 2009/0159252 A1 * | 6/2009 | Lai | ...................... | F28D 15/0275 165/171 |
| 2009/0277614 A1 * | 11/2009 | Lin | ..................... | F28D 15/0233 165/104.26 |
| 2012/0247735 A1 * | 10/2012 | Ito | ........................ | F28D 15/0275 165/104.21 |
| 2012/0273168 A1 * | 11/2012 | Peng | .................... | H01L 23/427 165/104.26 |
| 2013/0105123 A1 * | 5/2013 | Chen | ..................... | H01L 23/427 165/104.26 |
| 2014/0367074 A1 * | 12/2014 | Hirasawa | ............ | F28D 15/0275 165/104.26 |

FOREIGN PATENT DOCUMENTS

| | | |
|---|---|---|
| JP | 2014-139501 A | 7/2014 |
| JP | 5665948 B | 2/2015 |

OTHER PUBLICATIONS

Japanese Office Action issued in JP 2015-069308 dated Jan. 26, 2016.

* cited by examiner

HEAT SPREADING MODULE FOR PORTABLE ELECTRONIC DEVICE

CROSS REFERENCE TO RELATED APPLICATIONS

Priority is claimed on Japanese Patent Application No. 2015-0690308, filed on Mar. 30, 2015, the contents of which are incorporated herein by reference.

BACKGROUND OF THE INVENTION

Field of the Invention

The present invention relates to a heat spreading module that is used in a portable electronic device such as a multi-function portable telephone (a smartphone) or a tablet type personal computer.

Description of Related Art

In a portable electronic device into which heat generation components such as an arithmetic element and an integrated circuit are built in a highly dense manner, a heat spot in which a temperature increases locally occurs, and the temperature becomes a cause of limiting arithmetic operation speed, a cause of reducing durability, or the like. Furthermore, in the portable electronic device, thickness reduction, weight reduction, and miniaturization are required in order to achieve satisfactory portability.

Various means for heat releasing and cooling in the portable electronic device have been proposed in the related art. For example, an information terminal, in which, for heat spreading, a fine heat pipe that is arranged between a circuit board and a battery pack transports heat of electronic components, such as a CPU, to a metal plate that constitutes a rear surface of a case or a rear surface of a display, is disclosed in Japanese Unexamined Patent Application, First Publication No. 2014-139501.

Wish a configuration that is disclosed in Japanese Unexamined Patent Application, First Publication No. 2014-13501, heat transportation by the fine heat pipe over a wide range of the metal plate dissipates heat of a heat generation body widely and suppresses a temperature of the heat generation body from increasing. Space that can be allowed for the fine heat pipe which performs heat transportation is extremely limited. Particularly in recent years, it has been required that the size of the fine heat pipe should be equal to or less than 0.5 mm or that the fine heat pipe should be thinned down to the extent of less than 0.5 mm.

In the fine heat pipe described above, because heat transportation capability is limited, the fine heat pipe cannot transport the heat to the entire metal plate. Therefore, with thermal conductivity by the metal plate, the heat has to be carried to a place that is a great distance away from the electronic component, and it is difficult to widely dissipate the heat that occurs in the electronic component and thus to lower the heat of the heat spot.

SUMMARY OF THE INVENTION

The present invention, which is made in view of the circumstances described above, provides a heat spreading module that is capable of sufficiently and widely dissipating heat of an electronic component that is built into a portable electronic device, and thus lowering a temperature of the electronic component or a heat spot.

A first aspect of the present invention is a heat spreading module for a portable electronic device. The heat spreading module includes a metal plate to which a heat generation body contacts, a first heat pipe that is attached along the metal plate, transfers heat of a heating region of the metal plate, to which the heat generation body contacts, to a region that is away from the heating region of the metal plate, includes a first end portion and a second end portion, and has a predetermined length, and a portion of the first end portion is arranged in the heating region, and a second heat pipe that is arranged away from the heating region and is longer in length than the first heat pipe. The second end portion of the first heat pipe is arranged so as to approach a middle portion of the second heat pipe.

In a second aspect of the present invention according to the heat spreading module for a portable electronic device of the first aspect described above, the metal plate comprises a plurality of different plates, each of the first heat pipe and the second heat pipe has a flat shape, the metal plate has a groove in a front surface thereof, the first heat pipe and, the second heat pipe each having the Hat shape are arranged inside of the groove, and a thickness that is a distance from a rear surface of the metal plate to a surface of each of the heat pipes arranged in the groove is equal to or less than 0.4 mm.

In a third aspect of the present invention according to the heat spreading module for a portable electronic device of the first aspect or the second aspect described above, a plurality of the first heat pipes and a plurality of the second heat pipes are arranged, a distance between each of the second end portions of the plurality of the first heat pipes increases as the second end portions are separated from the heating region, and the plurality of the second heat pipes are arranged such that the plurality of the first heat pipes are interposed between the second heat pipes.

In a fourth aspect of the present invention according to the heat spreading module for a portable electronic device of the first aspect or the second aspect described above, a plurality of the first heat pipes and a plurality of the second heat pipes are arranged, the first end of the first heat pipe extends in an opposite direction from the heating region and then is bent, and the plurality of the second heat pipes are arranged such that the plurality of the first heat pipes are interposed between the second heat pipes.

According to an aspect of the present invention described above, heat of a heat generation body is transferred to a heat pipe and heat transportation is performed in such a manner that the heat is dissipated by the heat pipe to an entire metal plate. Arrangement of one portion of a first heat pipe in a heating region increases an amount of heat that is input into the first heat pipe.

Even though the amount of input heat is great because the first heat pipe is shorter than a second heat pipe and a distance over which the heat is transported is short, the heat is transported without dry-out. The second heat pipe is longer that the first heat pipe, and thus a distance over which the second heat pipe transports the heat is long. On the other hand, the first heat pipe transports the heat as described above, and thus the amount of heat that is input into the second heat pipe is reduced.

Furthermore, when the second heat pipe is arranged in a distance away from the healing region, the amount of heat that is input into the second heat pipe is smaller than the amount of heat that is input into the first heat pipe, for this reason, the second heat pipe transports the heat over a wide range of the metal plate for dissipation, without the dry-out. As a result, because the first heat pipe and the second heat pipe cooperate to dissipate the heat over the wide range of the metal plate, a temperature of a heat generation body can be suppressed from increasing.

DETAILED DESCRIPTION OF THE PREFERRED EMBODIMENTS

Figure 1:
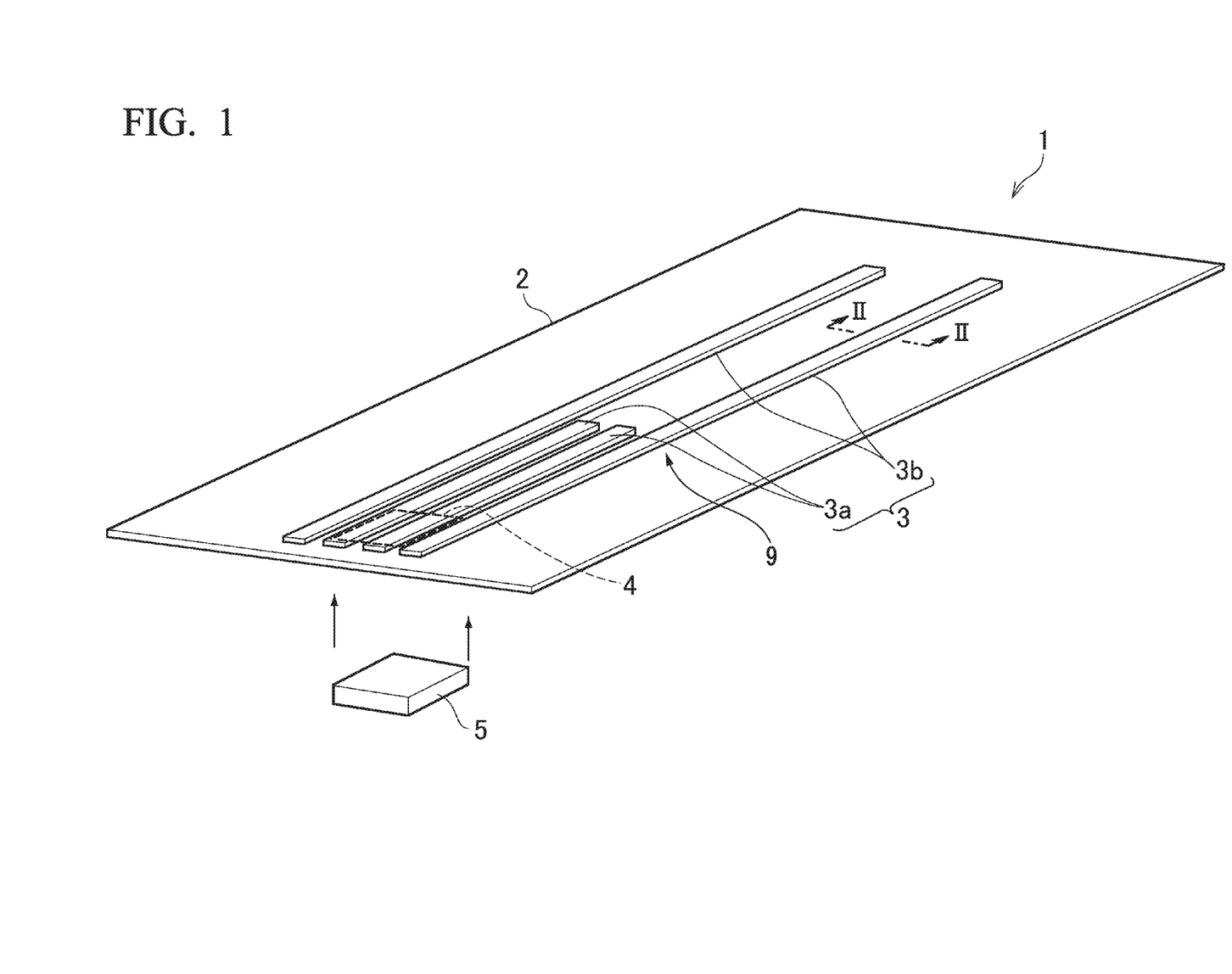
FIG. 1 is a perspective diagram that schematically illustrates one embodiment of the present invention.
Figure 2A:
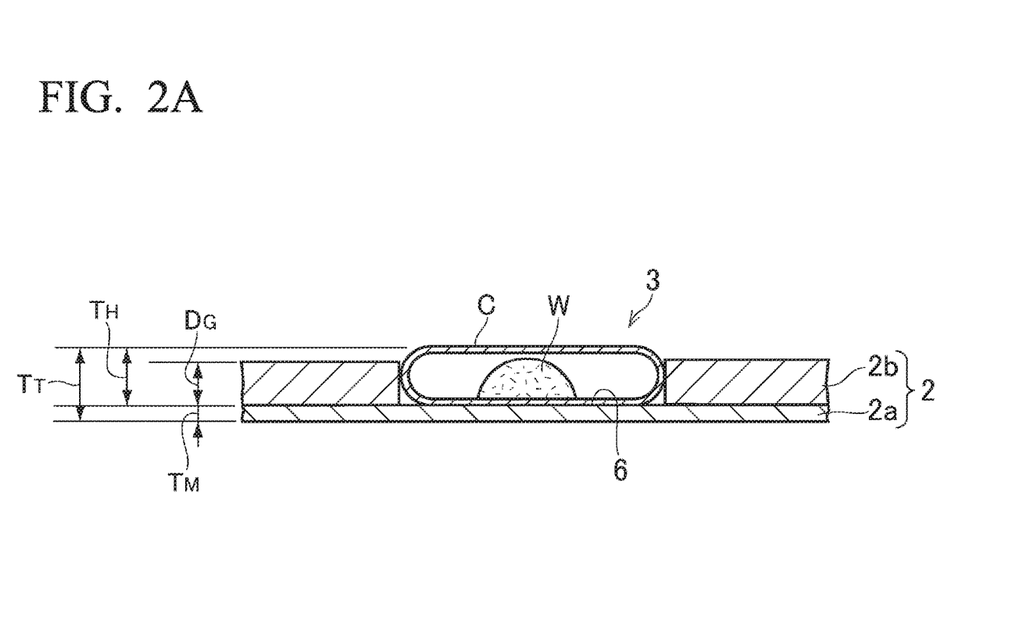
FIG. 2A is a cross-sectional diagram taken along line II-II in FIG. 1, which illustrates an example in which a copper plate and an aluminum plate are laminated to each other.
Figure 2B:
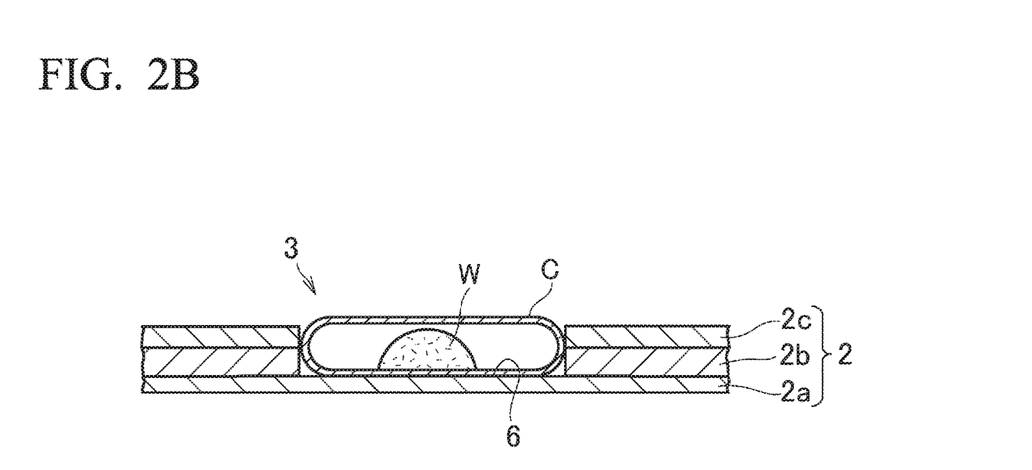
FIG. 2B is a cross-sectional diagram taken along line II-II in FIG. 1, which illustrates an example in which the copper plate, the aluminum plate, and another copper plate are laminated.

FIG. 1 illustrates one example of a heat dissipation plate (heat spreading module) 1 according to the present embodiment. The heat dissipation plate 1 is configured by placing and attaching multiple heat pipes 3 on and to one surface (hereinafter referred to as "front surface") of a metal plate 2. Heat that is transferred to a portion of the metal plate 2 is dissipated over a wide range of the metal plate 2. The metal plate 2 has predetermined strength that enables it to maintain its flatness, and has excellent thermal conductivity. The metal plate 2 can be a single plate or can include a plurality of different plates. As one example of this, as illustrated in FIG. 2A, the metal plate 2 is configured by laminating an aluminum plate (or aluminum alloy plate) 2b to a copper plate 2a. It is preferable that, as one example, the thickness of the copper plate 2a be 0.05 mm and the thickness of an aluminum plate 2b be 0.3 mm. Furthermore, as illustrated in FIG. 2B, a configuration can be employed in which the aluminum plate 2b and a different copper plate 2c are laminated in this order to the copper plate 2a. It is preferable that the thickness of the copper plate 2a be 0.05 mm, the thickness of the aluminum plate 2b be 0.25 mm, and the thickness of the different copper plate 2c is 0.05 mm. In the case of clad materials that include such aluminum plate 2b, the use of the aluminum plate 2b can prevent deformation such as a curvature or deflection and thus, maintain the flatness and further achieve weight reduction. Particularly, when it comes to the metal plate 2 that is configured by interposing the aluminum plate 2b between the copper plates 2a and 2c, the metal plate 2 has a low thermal resistance due to high thermal conductivity of the copper and thus, can be suitable as a heat dissipation plate.

In an example that is illustrated in FIG. 1, the metal plate 2 is formed into a shape of a square or a rectangle, and a region in the vicinity of a predetermined side of the shape of a square or a rectangle is a heating region 4. The heat generation body 5, such as an electronic component, is caused to contact (i.e., stick closely) to a predetermined place on the other surface (hereinafter referred to as "rear surface") of the metal plate 2. A place to which the heat generation body 5 contacts, or a portion in the thickness direction in a range of an area of the spot to which the heat generation body 5 contacts is the heating region 4. Therefore, on a front surface of the metal plate 2, a place in the range of the area at the same position as that of the place to which the heat generation body 5 contacts is also the heating region 4.

A groove 6 in which a heat pipe 3 is arranged is formed in the front surface of the metal plate 2. The grooved is schematically illustrated in FIG. 2. When the metal plate 2 is formed of a single copper plate, the groove 6 can be formed, by press processing, cutting processing, or the like. Furthermore, as described above, when the aluminum plate 2b or the other copperplate 2c is laminated to the copper plate 2a, a hole that corresponds to the groove 6 may be formed in the aluminum plate 2b or the other copper plate 2c that is laminated, and the groove 6 may be formed by superimposing the aluminum plate 2b or the other copper plate 2c on the copper plate 2a. Moreover, when the groove 6 extends over the entire metal plate 2 in the longitudinal direction or in the width direction, the aluminum plates 2b or the other copper plates 2c may be arranged on the copper plate 2a with an interval equivalent to a width of the groove 6 therebetween. Moreover, when the metal plate 2 is formed of a single copper plate, the depth of the groove 6 is approximately 0.3 mm. When the metal plate 2 is configured by laminating the aluminum plate 2b and the different copper plate 2c in this order on the copper plate 2a, the depth of the groove 6 is approximately 0.3 mm.

Next, the heat pipe 3 is described. According to the present embodiment, two types of heat pipes, that is, a long heat pipe and a short heat pipe, are used. Both of a short heat pipe (hereinafter referred to as "first heat pipe") 3a and a long heat pipe (hereinafter referred to a "second heat pipe") 3b are heat pipes in a flat shape. As illustrated in FIG. 2, each of the heat pipes 3a and 3b is formed by arranging a wick W made from bundled fine copper wires of copper or the like, or from a porous sintered body or the like inside of a metal pipe C such as a copper pipe, crushing the metal pipe C into a flat shape, and then injecting a working fluid, such as water, into the metal pipe C and enclosing the metal pipe C. As illustrated in FIG. 2, the thickness $T_H$ of the heat pipes 3a and 3b are, for example, 0.3 mm. Each of the heat pipes 3a and 3b is fitted into the groove 6 described above, and, together with the metal plate 2, is integrated, by bonding means such as solder, into one piece. The thickness $D_G$ of the groove 6 is 0.25 mm and the thickness $T_M$ of the copper plate 2a in the case of a lamination structure is 0.05 mm. Thus, the thickness $T_T$ as a whole, that is, a distance from a rear surface of the metal plate 2 to a front surface of the heat pipe 3 is 0.35 mm or is a distance that results from adding a manufacturing error or a measurement error to the distance of 0.35 mm. Therefore, the heat dissipation plate 1 has such a thickness that the heat dissipation plate 1 can be sufficiently built info a portable electronic device such as a smart phone.

Figure 3:
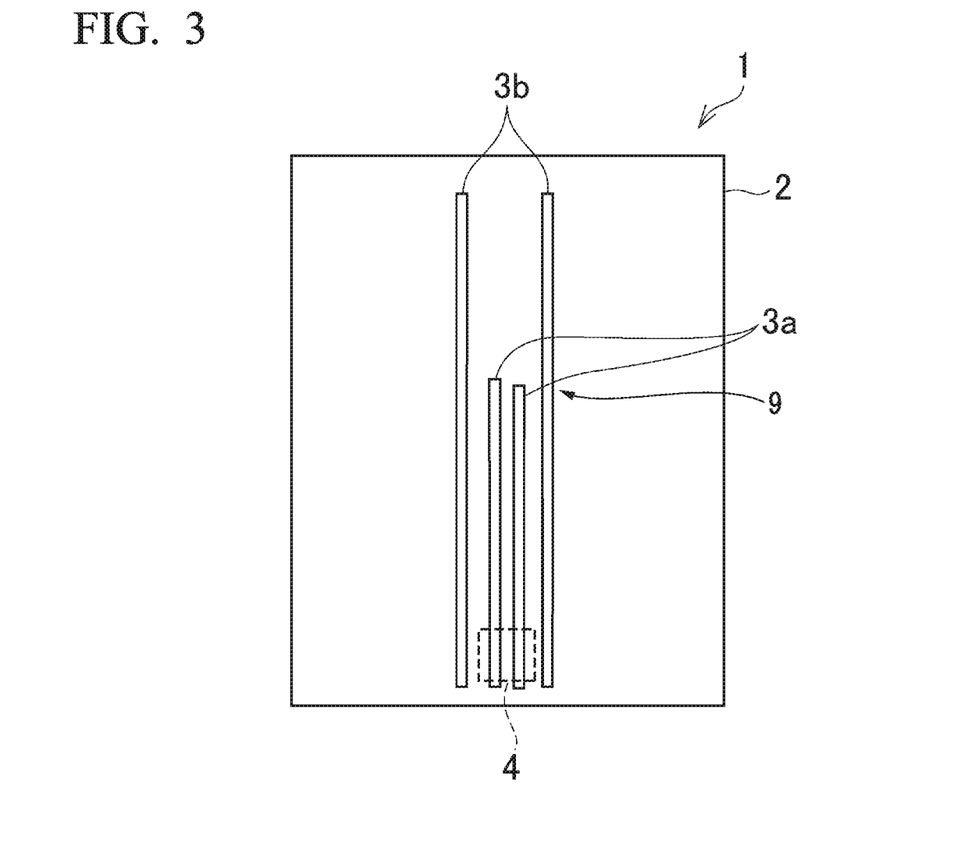
FIG. 3 is a schematic plan diagram illustrating one example of an arrangement of a heat pipe on a metal plate.

Arrangement of each of the heat pipes 3a and 3b is described as follows. FIG. 3 illustrates one example of the arrangement. Two first heat pipes 3a are arranged to be in parallel or close to each other. A first end portion (corresponding to an evaporator) of the first heat pipe 3a is arranged in the heating region 4. In an example that is illustrated in FIG. 3, because the heating region 4 is provided farther to the side of the first end portion in the longitudinal direction, of the metal plate 2 in the shape of a rectangle, the first heat pipe 3a is arranged in a state of extending from the heating region 4 toward the center portion of the metal plate 2. The length of each of the first heat pipes 3a is described as follows. The first heat pipe 3a is brought into contact with the heating region 4 and an amount of heat that is introduced from the heating region 4 is greater than an amount of heat that is input from the heat pipe 3b. In contrast, when the length is long, a heat transportation distance and a recirculation distance for a liquid phase working liquid become long and thus, dry-out occurs easily. On the other hand, because a function of the heat pipe 3a is to supplement heat spreading that cannot be sufficiently achieved by thermal conduction of the metal plate 2, and to dissipate the heat of the heating region 4 over a wide range of the metal plate 2, it is desirable that the heat pipe 3a is as long as possible. Therefore, the length of the heat pipe 3a is as long as possible, in such a manner that both of a requirement that the dry-out should not occur and a requirement that a range in which heat dissipates should be broad are satisfied. More specifically, considering an amount of heat that is generated by the heat generation body 5 and a heat transportation characteristic of the heat pipe 3a, the length of the heat pipe 3a is set to be as long as possible in a range in which, although an amount of heat that is transferred from the heating region 4 to the heat pipe 3a is the maximum, the dry-out does not occur. As one example, when the thickness is 0.3 mm, the width is 3.1 mm, and a maximum amount of input heat is 6 W (watt), it is preferable that the length be approximately 40 mm to 60 mm.

A second heat pipe 3b is longer in length than the first heat pipe 3a and is the same as the first heat pipe 3a in terms of a structure other than this length. In an example that is illustrated in FIG. 3, two second heat pipes 3b are used. The two second heat pipes 3b are arranged in parallel to the first heat pipe 3a in such a manner that the heating region 4 and the two first heat pipes 3a that are described above are interposed between the two second heat pipes 3b. Therefore, the second heat pipe 3b does not come into contact with the heating region 4. Moreover, the second heat pipe 3b may be arranged away from or in contact with the first heat pipe 3a. Furthermore, the second heat pipe 3b is arranged over almost the entire length of the metal plate 2.

The heat dissipation plate 1 that is configured as described above is arranged inside of a portable electronic apparatus device such as a smartphone. An electronic component (a heat generation body) 5, such as a CPU, contacts to the heating region 4, or another place on the metal plate 2 contacts to a ease, a display panel, a battery, or the like. Heat that is generated in the heat generation body 5 is transferred to the heating region 4. Because the first heat pipe 3a is arranged in the heating region 4, the first portion of the first heat pipe 3a is heated by the heat that is transferred to the heating region 4. The second end portion (corresponding to a condenser) of the first heat, pipe 3a extends to the center portion side of the metal plate 2 and is arranged so as to approach a middle portion 9 of the second heat pipe 3b. In other words, the second end portion of the first heat pipe 3a transfers the heat to the metal plate 2, a difference in temperature between the first end portion of the first heat pipe 3a and the second end portion occurs. Therefore, in the first heat pipe 3a, the working fluid evaporates as vapor at the first end portion side and the vapor flows to the second end portion side. Thereafter, the vapor is released and condenses. The working liquid recirculates to the heating region 4 side by virtue of capillary force that occurs in the wick W. That is, heat transportation by the first heat pipe 3a takes place, in such a case, because the first end portion of the lint heat pipe 3a is arranged in the heating region 4, an amount of input heat with respect to the first heat pipe 3a is greater than that with respect to the second heat pipe 3b. The first heat pipe 3a, as described above, is shorter that the second heat pipe 3b, and the distance that the heat is transported or the distance that the working liquid recirculates is short. Thus, although the amount of input heat is great, the heat transportation is performed without the dry-out.

On the other hand, because the second heat pipe 3b is away from the heating region 4, by the heat conduction through the metal plate 2, the heat is introduced to the second heat pipe 3b. For this reason, thermal resistance from, the heating region 4 or the heat generation body 5 to the second heat pipe 3b is greater than thermal resistance between the heating region 4 or the heat generation body 5 and the first heat pipe 3a. For this reason, a thermal load on the second heat pipe 3b or an amount of heat transported, by the second heat pipe 3b is smaller than a thermal load on the first heat pipe 3a or an amount of heat transported by the first heat pipe 3a. Therefore, even though the distance that the heat is transported by the second heat pipe 3b is long, the second heat pipe 3b performs the heat transportation without causing dry-out.

Furthermore, the heat that is transferred from the second end portion of the first heat pipe 3a to the metal plate 2 is transferred to the middle portion 9 of the second heat pipe 3b through the metal plate 2. The second heat pipe 3b transports the heat to a spot of which a temperature is low. That is, delivery of the heat from the first heat pipe 3a to the second heat pipe 3b occurs and thus the heat is transported over the wide range of the metal plate 2.

In this manner with the heat dissipation plate 1 according to the present embodiment, because the first heat pipe 3a and the second heat pipe 3b cooperate to transport the heat from the heating region 4 over the wide range of the metal plate 2, a situation for dissipation, such as one where the heat builds up in the heating region 4 or the heat generation body 5 and thus the temperature increases, can be removed or suppressed. That is, the temperature of the heat spot can be lowered. Particularly, in the heat dissipation plate 1 according to the present embodiment, because the distance that the first heat pipe 3a of which the first, end portion is arranged in the heating region 4 and thus on which the thermal load is great transports the heat is shortened, the first heat pipe 3a can be made to operate smoothly without causing a heat transportation defect such as dry-out. Additionally, because the insufficiency in the distance that the first heat pipe 3a transports the heat, or the insufficiency in the range of the heat spreading is compensated for by further performing the heat transportation using the second heat pipe 3b with a long length, the heat can be transported over the wide range of the entire metal plate 2 for dissipation.

Figure 4:
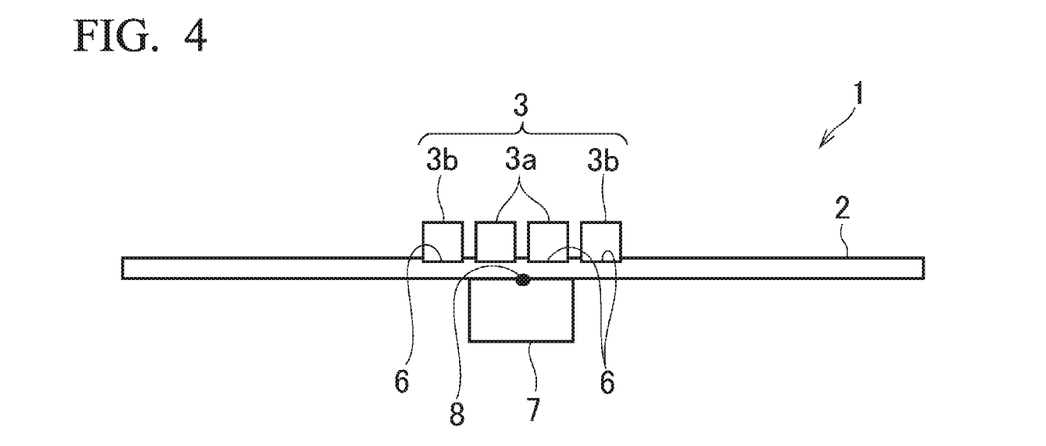
FIG. 4 is a schematic diagram illustrating a measurement point in a measurement experiment for a temperature and a thermal resistance.

The results of an experiment in an example according to the present embodiment will be described below, in the present example and a comparative example, the front-surface temperature and the thermal resistance of the heat generation body 5 that contacts to the heating region 4 are measured. In the present example, in the heat dissipation plate 1, the two first heat pipes 3a and the two second heat pipes 3b are arranged as illustrated in FIG. 3. In the comparative example, four second heat pipes 3b, each with a long length, are used as heat dissipation plates. Among the four second heat pipes 3b, two heat pipes 3b are brought into contact with the heating region 4, and the other two heat pipes 3b are arranged in parallel to each other without being brought into contact with the heating region 4. That is, in the comparative example, the first heat pipe 3a with a short length is not used. Moreover, in the experiment, as schematically described in FIG. 4, a heater 7 contacts to the heating region 4 on the rear surface of the metal plate 2 and a measurement point 8 between the heater 7 and the metal plate 2 is defined as the point at which the temperature is measured. Furthermore, in a situation where an ambient temperature in the vicinity of the heat dissipation plate is maintained at 25° C. and where an output (the amount of heat that is introduced to the heat dissipation plate) of the heater 7 is changed to 4 W, 5 W, and 6 W, a temperature at the measurement point 8 was obtained. Furthermore, in the situation where the output of the heater 7 is changed to 4 W, 5 W, and 6 W, the thermal resistance was obtained. A thermal resistance R (° C./W) was obtained by subtracting a difference between a temperature $T_h$ at the measurement point 8 and an ambient temperature (room temperature) $T_{room}$ from an amount Q of heat that is generated by the heater 7.

$$R=(T_h-T_{room})/Q$$

Figure 5:
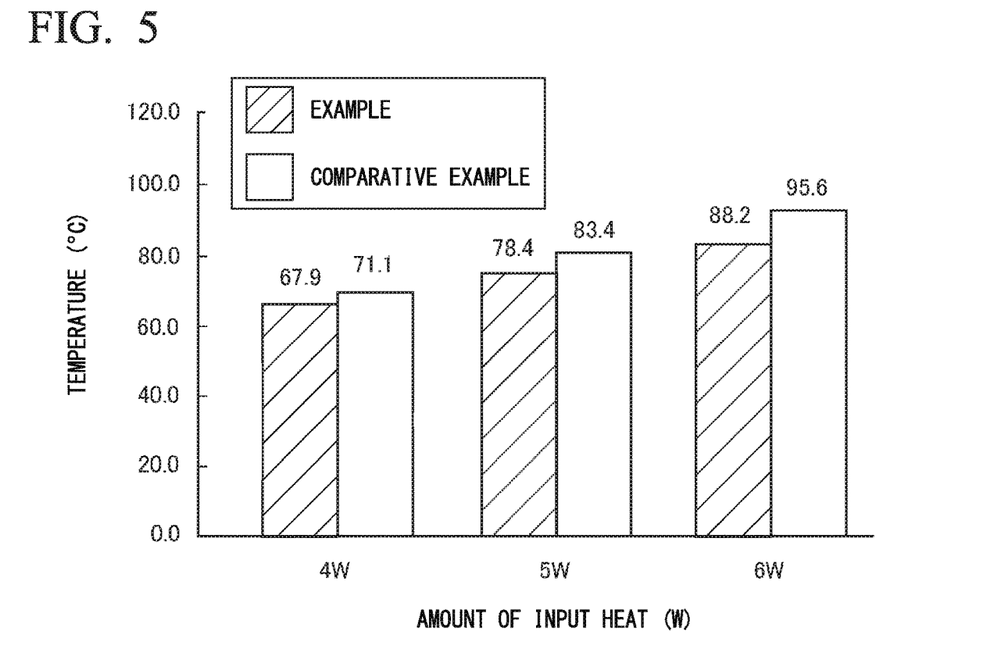
FIG. 5 is a diagram illustrating a result of measurement of temperatures at measurement points in an example according to the present invention and a comparative example.

The temperature at the measurement point 8 is illustrated in FIG. 5. As the output of the heater 7 increases, the temperature at the measurement point 8 becomes higher; however, the temperature in the present example is lower in terms of any of the outputs than in the comparative sample. While the difference in temperature is 3.2° C. when the output of the heater 7 is 4 W, the differences in temperature are 5.0° C. and 7.4° C. when the outputs of the heater 7 are 5 W and 6 W, respectively. That is, it is understood that, when the output is equal to or more than 5 W that is a normally required output, heat spreading (or cooling) according to the present example is better.

Figure 6:
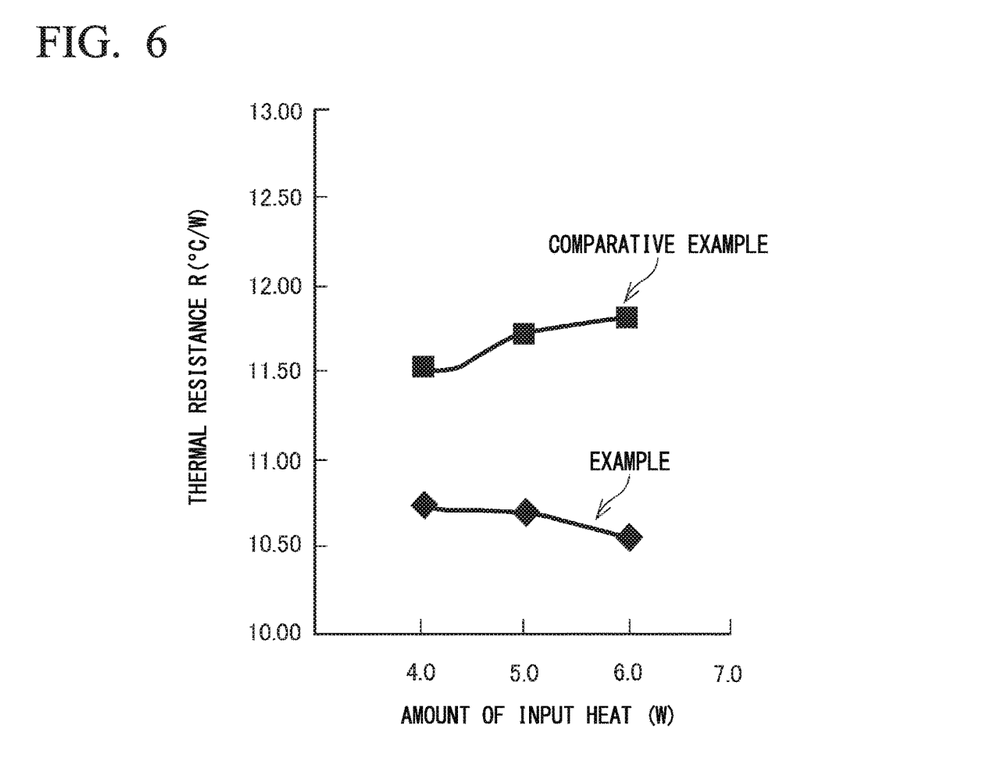
FIG. 6 is a diagram illustrating a result of measurement of thermal resistances in the example according to the present invention and the comparative example.

In addition, a result of measuring a thermal resistance R is illustrated in FIG. 6. It is understood that the thermal resistance R in the present example is smaller than the thermal resistance R in the comparative example, and that heat spreading performance (or cooling performance) in the present example is better. Furthermore, in the present example, even though the output of the heater 7 increases, the thermal resistance II does not change or decreases to some degree. In contrast, in the comparative example, as the output of the heater 7 increases, the thermal resistance R increases. This may be that because the thermal resistance R increases with an increase in the temperature at the measurement point 8, in the comparative example, the amount of the heat transportation by the heat pipe decreases with an increase in the output of the heater 7 and thus the thermal resistance R increases. It is estimated that this is caused because the heat pipe begins to partially dry out.

In the present embodiment, the first heat pipe 3a and the second heat pipe 3b are used together, and the first heat pipe 3a is arranged in such a manner that the heat is transported from the heating region 4. Accordingly, although the amount of heat that is generated by the heat generation body 5 is great, the heat can be transported stably over the wide range of the metal plate 2 for dissipation. It is understood that, for this reason, the temperature of the heat generation body 5 is prevented from increasing, and thus that the temperature of a so-called heat spot can be lowered.

Figure 7:
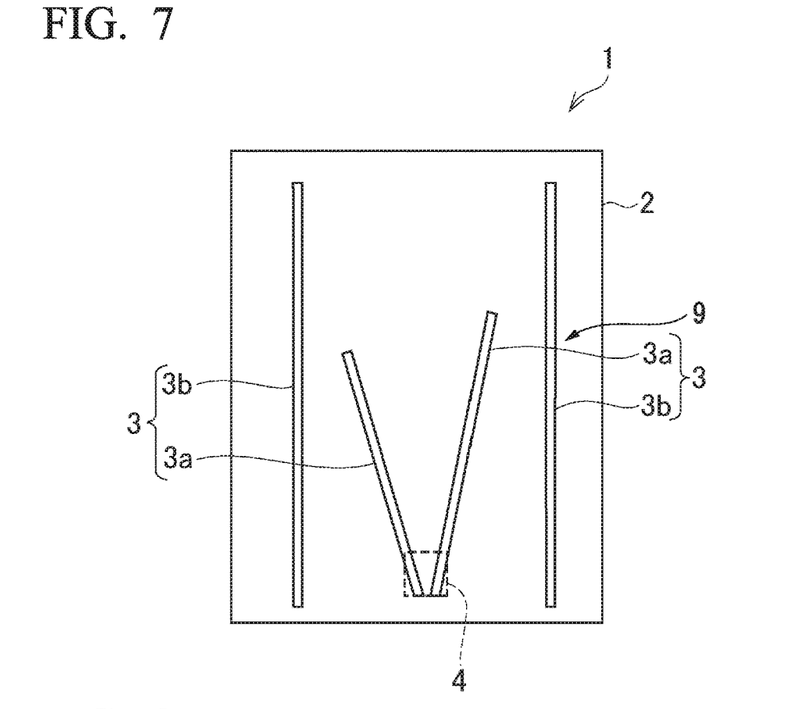
FIG. 7 is a schematic plan diagram illustrating another example of an arrangement of the heat pipe on the metal plate according to the present invention.

Moreover, a method of arranging each of the heat pipes 3a and 3b according to the present embodiment is not limited to the above-described example that is illustrated in FIG. 3. For example, as illustrated in FIG. 7, the first, end portions of the two first heat pipes 3a may be positioned in the heating region 4, and the second end portions may be arranged in such a manner that the distance between them increases. Additionally, the two second hem pipes 3b may be arranged in parallel to each other in such a manner the two first heat pipes 3a and the heating region 4 are interposed between the two second beat pipes 3b. When each of the heat pipes 3a and 3b is arranged as illustrated in FIG. 7, the first heat pipe 3a transports the heat not only in the longitudinal direction of the metal plate 2, but also in the width direction. For this reason, the heat transportation or the heat spreading to a place, which is away from the heat region 4 and has a lower temperature or a place in which the beat is released easily, is facilitated. Because the heat that is transported by the first heat pipe 3a is further transported or dissipated by the second heat pipe 3b, the heat that is input into the heating region 4 is dissipated over the wide range of the entire metal plate 2. Thus, the temperature of the heat spot can be decreased more effectively.

Figure 8:
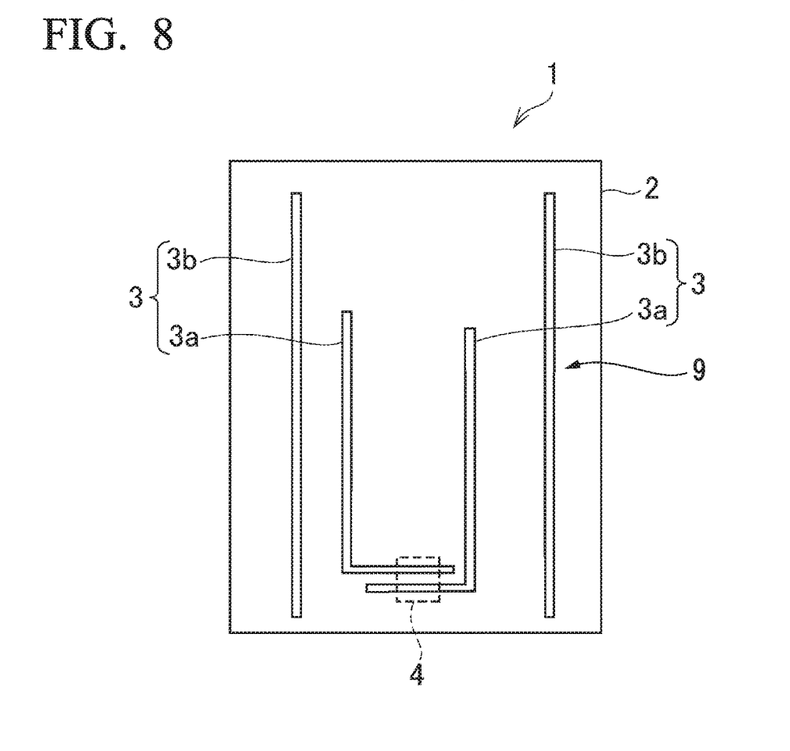
FIG. 8 is a schematic plan diagram illustrating the other example of an arrangement of the heat pipe on the metal plate according to the present invention.

FIG. 8 is an example in which the two first heat pipes 3a are bent in an "L"-shape. Short arm portions of the first heat pipes 3a contacts to the heating region 4 in opposite directions in the width direction of the metal plate 2. Furthermore, long arm portions extend vertically in the longitudinal direction of the metal plate 2, starting from the tip portions of the short arm portions that extend in the opposite direction from the heating region 4 and run in parallel to each other. Therefore a distance between the long arm portions of the first heat pipes 3a is greater than the width of the heating region 4.

The two second heat pipes 3b are arranged in parallel to each other in such a manner that the two first heat pipes 3a and the heating region 4 are interposed between the two second heat pipes 3b. In an example that is illustrated in FIG. 8, the short arm portions of the first heat pipes 3a that are brought into contact with the heating region 4 transport the heat toward the width direction of the metal plate 2. For this reason, the transportation or transfer of the heat to the one-end portions of the second heat pipes 3b is facilitated, and an amount of heat transportation by the second heat pipes 3b increases. Furthermore, because the long arm portions of the first heat pipes 3a that are brought into contact with the heating region 4 are arranged toward the longitudinal direction of the metal plate 2, the transportation or dissipation of the heat to a place away from the heating region 4 is facilitated. Particularly, because the long arm portions of the first heat pipes 3a that are brought into contact with the heating region 4 are arranged away from the metal plate 2 in the width direction, the heat spreading by the first heat pipes 3a to the metal plate 2 in the width direction is facilitated. As described above, in the example that is illustrated in FIG. 8, the dissipation by the first heat pipes 3a of the heat to the metal plate 2 in the width direction and the longitudinal direction and the dissipation by the second, heat pipes 3b of the heat to the metal plate 2 in the longitudinal direction are facilitated. For this reason, the heat that is input into the heating region 4 is dissipated, over the wide range of the entire metal plate 2. Thus, the temperature of the heat spot can be decreased more effectively.

While preferred embodiments of the invention have been described and illustrated above, it should be understood that these are exemplary of the invention and are not to be considered as limiting. Additions, substitutions and other modifications can be made without departing from the spirit or scope of the present invention. Accordingly, the invention is not to be considered as being limited by the foregoing description and is only limited by the scope of the appended claims.

What is claimed is:

1. A heat spreading module for a portable electronic device, the heat spreading module comprising:
a metal plate to which a heat generation body contacts;
a first heat pipe, that is attached along the metal plate, that transfers heat of a heating region of the metal plate, to which the heat generation body contacts, to a region that is away from the heating region of the metal plate, the first heat pipe comprises a first end portion and a second end portion, and has a predetermined length, and a portion of the first end portion is arranged in the heating region;
a second heat pipe comprising longitudinal ends that are arranged away from the heating region and the second heat pipe is longer in length than the first heat pipe; and
a third heat pipe and a fourth heat pipe attached along the metal plate,
wherein the second end portion of the first heat pipe is arranged so as to approach a middle portion of the second heat pipe, and an edge of the first heat pipe is arranged so as to stop at the middle portion of the second heat pipe,
wherein, in a direction from the heat generation body to the metal plate, the first heat pipe is arranged directly over the heat generation body and the second heat pipe is not arranged directly over the heat generation body,
wherein the longitudinal ends of the second heat pipe are opposite to each other across a straight portion of the second heat pipe,
wherein the second heat pipe is entirely straight,
wherein the first heat pipe and the second heat pipe are extended along a length of the metal plate in a longitudinal direction of the metal plate,
wherein, in the longitudinal direction, the heat generation body is arranged nearer to a first longitudinal end of the metal plate than to a longitudinal center of the metal plate, and
wherein the heating region is arranged over the heat generating body in a width direction perpendicular to the longitudinal direction and from the heat generating body to the first heat pipe,
wherein the third heat pipe is extended along the metal plate and from the heating region, at the heat generation body,
wherein the fourth heat pipe is extended along the metal plate and from outside of the heating region,
wherein the third heat pipe and the fourth heat pipe are extended in parallel with the first heat pipe and the second heat pipe,
wherein, in a width direction perpendicular to both the thickness direction and the longitudinal direction, the first heat pipe and the third heat pipe are arranged on the metal plate in between the second heat pipe and the fourth heat pipe,
wherein first lengths, in the longitudinal direction, of the first heat pipe and the third heat pipe are equal,
wherein second lengths, in the longitudinal direction, of the second heat pipe and the fourth heat pipe are equal,
wherein, in the longitudinal direction, the second heat pipe and the third heat pipe each extend from positions closer to ones of the first longitudinal end and a second longitudinal end, opposite the first longitudinal end, of the metal plate than to the longitudinal center of the metal plate, and
wherein the first heat pipe and the third heat pipe are each L-shaped with longest sides of their L-shape extended in the longitudinal direction and shortest sides of their L-shape oppositely crossing through the heating region.

2. The heat spreading module for the portable electronic device according to claim 1, wherein:
the metal plate comprises a plurality of different plates;
each of the first heat pipe and the second heat pipe has a flat shape;
the metal plate has a groove in a front surface thereof;
the first heat pipe and the second heat pipe each having the flat shape are arranged inside of the groove; and
a thickness that is a distance from a rear surface of the metal plate to a surface of each of the first heat pipe and the second heat pipe arranged in the groove is equal to or less than 0.4 mm.

3. The heat spreading module according to claim 1, wherein, in the direction, at least part of the metal plate is between the first heat pipe and the heat generation body.

4. The heat spreading module according to claim 1, wherein the metal plate comprises a plurality of layers of metal stacked on each other in the direction,
at least one of the plurality of layers of metal comprises a groove formed therein,
at least one of the first heat pipe and the second heat pipe is arranged in the groove.

5. The heat spreading module according to claim 4, wherein, in the direction, at least one other of the plurality of layers of metal is between the heat generation body and the at least one of the first heat pipe and the second heat pipe.

6. The heat spreading module according to claim 4, wherein the plurality of layers of metal comprise a first layer, a second layer and a third layer,
in the direction, the first layer interposes the heat generation body and the at least one of the first heat pipe and the second heat pipe, and the second layer and the third layer do not interpose the heat generation body and the at least one of the first heat pipe and the second heat pipe,
the first layer comprises copper on which the second layer is arranged,
the second layer comprises aluminum on which the third layer is arranged, and
the third layer comprises copper.

7. The heat spreading module according to claim 4, wherein the at least one of the first heat pipe and the second heat pipe protrudes from the metal plate in the direction.

8. The heat spreading module according to claim 1, wherein an entirety of the second heat pipe is outside of the heating region.

9. The heat spreading module according to claim 1, wherein the heating region is an area of the metal plate contacted by the heat generation body.

10. A heat spreading module for a portable electronic device, the heat spreading module comprising:
a metal plate to which a heat generation body contacts;
a first heat pipe, that is attached along the metal plate, that transfers heat of a heating region of the metal plate, to which the heat generation body contacts, to a region that is away from the heating region of the metal plate, the first heat pipe comprises a first end portion and a second end portion, and has a predetermined length, and a portion of the first end portion is arranged in the heating region; and
a second heat pipe that is arranged away from the heating region and is longer in length than the first heat pipe,
wherein the second end portion of the first heat pipe is arranged so as to approach a middle portion of the second heat pipe, and an edge of the first heat pipe is arranged so as to stop at the middle portion of the second heat pipe, and wherein, in a direction from the heat generation body to the metal plate, the first heat pipe is arranged directly over the heat generation body and the second heat pipe is not arranged directly over the heat generation body, wherein the first heat pipe and the second heat pipe are extended along a length of the metal plate in a longitudinal direction of the metal plate, wherein, in the longitudinal direction, the heat generation body is arranged nearer to a first longitudinal end of the metal plate than to a longitudinal center of the metal plate, and wherein the heating region is arranged over the heat generating body in a width direction perpendicular to the longitudinal direction and from the heat generating body to the first heat pipe, wherein the heat spreading module further comprises a third heat pipe and a fourth heat pipe attached along the metal plate, wherein the third heat pipe is extended along the metal plate and from the heating region, at the heat generation body, wherein the fourth heat pipe is extended along the metal plate and from outside of the heating region, wherein the third heat pipe and the fourth heat pipe are extended in parallel with the first heat pipe and the second heat pipe, wherein, in a width direction perpendicular to both the thickness direction and the longitudinal direction, the first heat pipe and the third heat pipe are arranged on the metal plate in between the second heat pipe and the fourth heat pipe, and wherein first lengths, in the longitudinal direction, of the first heat pipe and the third heat pipe are equal, and wherein second lengths, in the longitudinal direction, of the second heat pipe and the fourth heat pipe are equal, wherein, in the longitudinal direction, the second heat pipe and the third heat pipe each extend from positions closer to ones of the first longitudinal end and a second longitudinal end, opposite the first longitudinal end, of the metal plate than to the longitudinal center of the metal plate, and wherein the first heat pipe and the third heat pipe are each L-shaped with longest sides of their L-shape extended in the longitudinal direction and shortest sides of their L-shape oppositely crossing through the heating region.

* * * * *